United States Patent

Scheffner

[11] Patent Number: 5,755,822
[45] Date of Patent: May 26, 1998

[54] CONDITION-INDICATING ELECTRICAL CONNECTOR

[75] Inventor: Wolfgang Scheffner, Eppertshausen, Germany

[73] Assignee: Weidmüller Interface GmbH & Co., Detmold, Germany

[21] Appl. No.: 715,581

[22] Filed: Sep. 19, 1996

[30] Foreign Application Priority Data

Sep. 26, 1995 [DE] Germany .......................... 195 35 714.0

[51] Int. Cl.⁶ ...................................................... H01R 3/00
[52] U.S. Cl. ............................................................ 439/490
[58] Field of Search ................................. 439/488, 489, 439/490

[56] References Cited

U.S. PATENT DOCUMENTS 5,062,806  11/1991  Ohno et al. ............................ 439/490

FOREIGN PATENT DOCUMENTS 365698   5/1990  European Pat. Off. .
4035369  3/1992  Germany .

Primary Examiner—Neil Abrams
Assistant Examiner—Yong Ki Kim
Attorney, Agent, or Firm—Laubscher & Laubscher

[57] ABSTRACT

A condition-indicating electrical connector includes a non-conductive synthetic plastic connector body carrying a strip conductor that connects a terminal on the body with an electrically-responsive optical display device arranged at a visible location on the connector body, thereby to indicate the electrical status of the terminal, and thus, consequently, the printed circuit conductor electrically connected therewith. The optical device is thus integral with the connector body, and requires no additional electrical components, and requires no space on the printed circuit board.

7 Claims, 3 Drawing Sheets

CONDITION-INDICATING ELECTRICAL CONNECTOR

BACKGROUND OF THE INVENTION

1. Field of the Invention

A condition-indicating electrical connector for printed circuit boards and the like includes a non-conducting synthetic plastic body that carries a strip conductor which connects a terminal that engages the printed circuit board with an electrically-responsive optical indicating device, such as a light emitting diode, mounted on the connector body, thereby to visually indicate the electrical condition of the terminal and the associated circuit on the printed circuit board.

2. Brief Description of the Prior Art

It has been proposed in the prior art to provide an optical display for indicating the conductive state of a conductor or a component of a printed circuit board. In the European patent No. 365,698 A1, for example, a photo diode is mounted on the printed circuit board behind the printed circuit board connector for emitting light that is conducted to an optically visible place by light conducting rods or the like that are mounted on the reverse side of the printed circuit connector. Status display devices are also known including photo diodes having very long connecting terminals arranged in special adaptor parts that must again be mounted on the printed circuit board connecting elements. These connecting terminals of the photo diodes are then connected with the printed circuit board, as shown by the German patent No. 40 35 369 C1. Additionally, complicated and expensive components are normally required for the display device, whereby a considerable amount of space is taken up by the display device.

The present invention was developed to provide a conductive status indicating arrangement of inexpensive simple construction that is easy to produce, and which saves a considerable amount of space on the printed circuit board.

SUMMARY OF THE INVENTION

Accordingly, a primary object of the present invention is to provide an improved condition-indicating electrical connector for printed circuit boards including a non-conductive connector body, a terminal adapted to engage a conductor on the printed circuit board, an optical display device mounted on the connector body at a visible location, and a strip conductor mounted on the connector body for connecting the terminal with the optical display device. Preferably, the strip conductor is metallized and is formed, for example, by vapor deposition.

In a first embodiment, the terminal on the connector body is a plug-in terminal adapted for engagement with a corresponding contact contained in a opening on the printed circuit board, thereby to physically connect the connector with the printed circuit board. In another embodiment, the terminal on the connector comprises a conductive strip that engages a corresponding strip on the printed circuit board, the connector and the printed circuit board being held together by soldered connections.

According to a further object of the invention, an electrical component can be connected in series with the strip conductor, thus avoiding the necessity for conductive leads from the component, thereby resulting in further space savings. In addition to a simplified assembly with very short installation times, a considerable saving in space requirements on the printed circuit board is achieved, since the space hitherto required for the status display device is no longer needed. Moreover, a luminous display of very high quality may be provided on the connector for displaying status of universally different signal levels. The strip connector mounted on the connector body can connect the photo diodes arranged at a desired visible location with the terminals carried by the connector body and whose conductive state is to be measured.

BRIEF DESCRIPTION OF THE DRAWINGS

Other objects and advantages of the invention will become apparent from a study of the following specification when viewed in the light of the accompanying drawings, in which.

DETAILED DESCRIPTION

Figure 1:
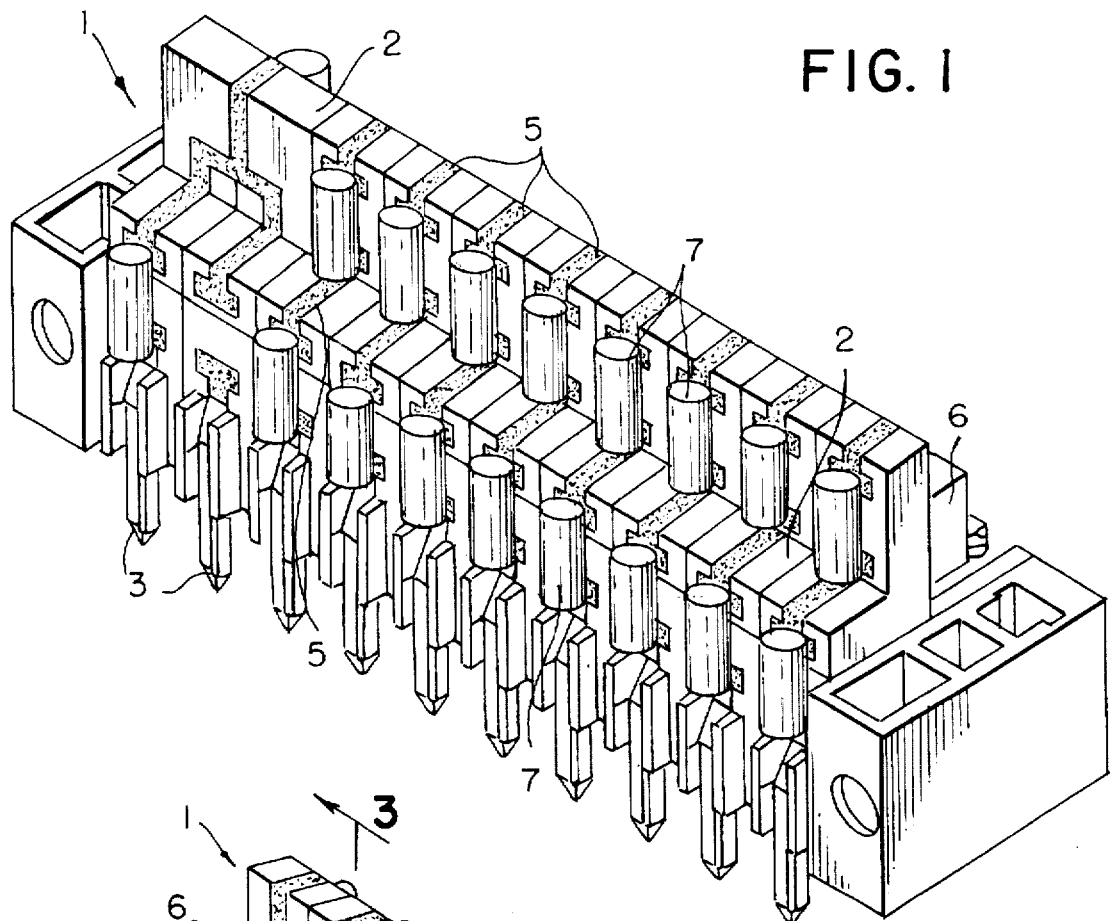
FIGS. 1 and 2 are rear and front perspective views, respectively, of a first embodiment of the condition-indicating connector of the present invention.
Figure 2:
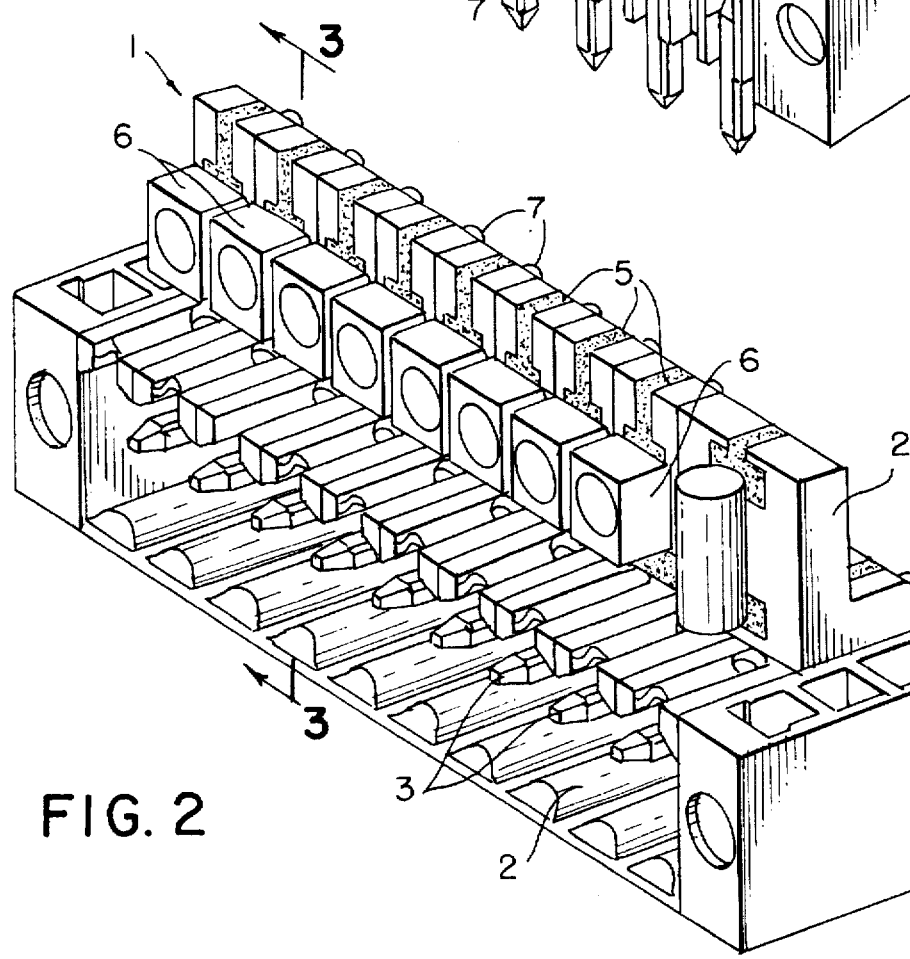
Figure 3:
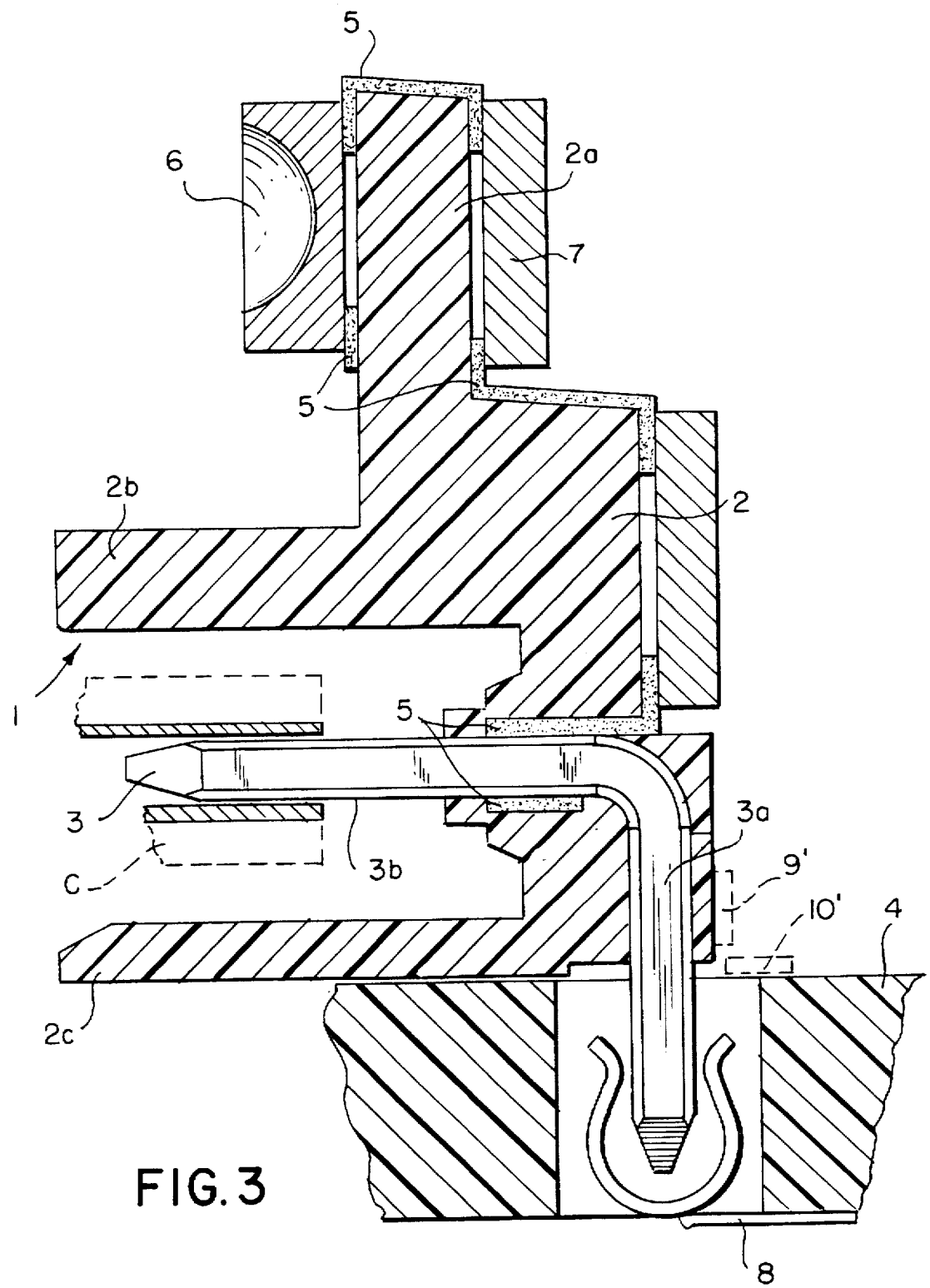
FIG. 3 is a sectional view taken along line 3—3 of FIG. 2.

Referring first more particularly to FIGS. 1–3, the electrical connector assembly 1 includes a plurality of connectors each having a connector body formed from a suitable non-conductive synthetic plastic material, such as polypropylene, polybutylene or the like. Mounted within the connector body is an L-shaped plug-in terminal 3 having a downwardly extending leg portion 3a that is adapted to engage a corresponding resilient terminal T carried by the circuit board 4, and a horizontal portion 3b adapted for insertion within the corresponding tubular terminal of an electrical component C.

Mounted on the connector body 2 is a metallized strip conductor 5 formed, for example, by vapor deposition. As shown in FIG. 3, the strip conductor 5 electrically connects the L-shaped terminal 3 with a photo diode 6 that is mounted (for example, by soldering) at a visible location upon the front face of the connector body 2. Electrical components 7a and 7b, such as resistors or capacitors, mounted on the connector body are connected in series with the strip conductor 5.

Thus, as shown in FIGS. 1 and 2, all of the status display devices 6 are arranged on the connector assembly 1 at a desired visible location, whereby no additional space is required on the printed circuit board itself.

According to current technology, there are two alternate procedures for forming the connector of the present invention. For example, when a catalytic synthetic plastic material is used to form the connector body, the body may be formed by injection molding to a finished condition by the injection of first and second charges, and then applying the metallized strip conductor 5. Alternatively, when a non-catalytic synthetic plastic material is used, a first charge is injected into the mold and is then catalyzed, whereupon the second charge of material is injected, followed by metallizing to form the strip conductor.

Figure 4:
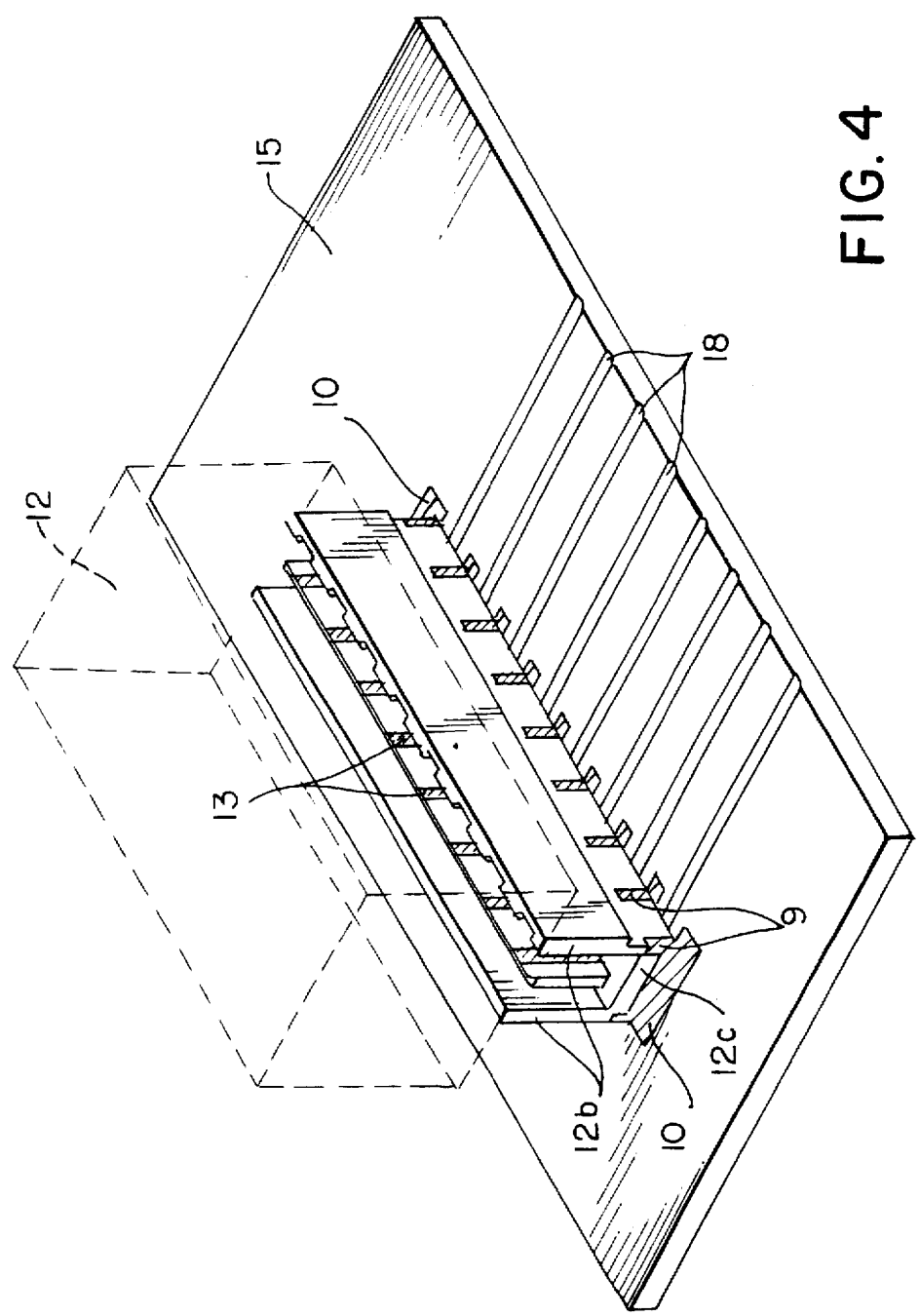
FIG. 4 is a detailed perspective view of a second embodiment of the invention.

Referring now to FIG. 4, as an alternative to the plug-in type of pin terminals, it is also possible to provide a metallized strip conductor that directly engages a corresponding conductor mounted on the face of the printed circuit board In this case, the metallized strip conductors 13 are arranged between rib portions 12a of the parallel spaced downwardly extending leg portions 12b at the bottom of the conductor body 12. The strip conductors 13 extend downwardly through passages contained in the base portion 12c of the connector body for direct electrical contact with corresponding strip conductors 18 on the surface of the printed circuit board 15. The connector body is fastened to the printed circuit board by soldered connections between the soldering fittings 9 and 10 on the connector body base portion 12c and on the printed circuit board 15, respectively.

If desired, similar soldering fittings 9' and 10' may be provided for connecting the connector body 2 of FIG. 2 with the associated printed circuit board 4, respectively, thereby to rigidly fasten the connector body with the printed circuit board. In this manner, the printed circuit board connector is both electrically and mechanically connected in one operation with the printed circuit board (i.e., in a so-called surface assembly process).

While in accordance with the provisions of the Patent Statutes the preferred forms and embodiments of the invention have been illustrated and described, it will be apparent to those skilled in the art that various changes may be made without deviating from the invention as disclosed above

What is claimed is:

1. A condition-indicating electrical connector means adapted for connection with a conductor on a printed circuit board, comprising:
   (a) a non-conductive synthetic plastic connector body (2) having front, first side, second side, end, top, and bottom surfaces said bottom surface being adapted to engage the printed circuit board;
   (b) a first conductor (3;13) mounted on said connector body for connection with a corresponding conductor (8; 18) on the printed circuit board;
   (c) electrically-responsive optical display means (6) mounted on said connector body above said bottom surface in spaced relation to said first conductor; and
   (d) strip conductor means (5) mounted on said connector body for electrically connecting said first conductor with said optical display means, said strip conductor means consisting of a metallized conductor deposited on and adhering to a plurality of said connector body surfaces to form a conductive path between said first conductor and said optical display means, whereby said optical display means indicates the electrical status of said first conductor.

2. The connected means as defined in claim 1, wherein said first conductor includes a plug-in pin terminal that extends downwardly from said connector body for connection with said printed circuit board.

3. The connector means as defined in claim 1, and further including at least one electrical component (7) mounted on said connector body and electrically connected with said strip connector.

4. The connector means as defined in claim 1, wherein said first conductor comprises a second strip conductor extending to said connector body bottom surface for direct connection with a conductor (18) on the printed circuit board.

5. The connector means as defined in claim 1, wherein said first conductor and the printed circuit board conductor are angularly arranged relative to each other, thereby to define a three-dimensional configuration.

6. The connector means as defined in claim 5, and further including solder means (9,10) for permanently connecting said connector body with the printed circuit board.

7. A condition-indicating electrical connector means adapted for connection with a conductor on a printed circuit board, comprising:
   (a) a non-conductive synthetic plastic connector body (2) having front, first side, second side, end, top, and bottom surfaces, said bottom surface being adapted to engage the printed circuit board;
   (b) a first conductor (3;13) mounted on said connector body for connection with a corresponding conductor (8;18) on the printed circuit board;
   (c) electrically-responsive optical display means (6) mounted on said connector body first side surface above said bottom surface in spaced relation to said first conductor; and
   (d) strip conductor means (5) mounted on said connector body for electrically connecting said first conductor with said optical display means, said strip conductor means extending upwardly from said first conductor, across said connector body second side surface, and across said connector body top surface for connection with said optical display means, whereby said optical display means indicates the electrical status of said first conductor.

* * * * *